(12) United States Patent
Song

(10) Patent No.: US 8,593,186 B2
(45) Date of Patent: Nov. 26, 2013

(54) CONTROL SIGNAL GENERATOR FOR USE WITH A COMMAND DECODER

(75) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/602,025

(22) Filed: Aug. 31, 2012

(65) Prior Publication Data
US 2013/0249608 A1    Sep. 26, 2013

(30) Foreign Application Priority Data
Mar. 26, 2012  (KR) .................. 10-2012-0030588

(51) Int. Cl.
*H03L 7/00*         (2006.01)
*G11C 8/00*         (2006.01)

(52) U.S. Cl.
USPC ........ 327/141; 327/108; 327/155; 365/233.1; 365/233.12

(58) Field of Classification Search
USPC ......... 327/155, 291, 141, 142, 108, 198, 544, 327/160, 161; 365/233.1, 233.12; 326/93, 326/104–105
See application file for complete search history.

(56) References Cited

U.S. PATENT DOCUMENTS 6,014,341 A  *  1/2000  Koshikawa ............... 365/233.12
6,842,373 B2    1/2005  La et al.
7,715,273 B2 *  5/2010  Kinoshita et al. .......... 365/233.1

FOREIGN PATENT DOCUMENTS

KR      1020090063606      6/2009

* cited by examiner

*Primary Examiner* — Lincoln Donovan
*Assistant Examiner* — Thomas Skibinski
(74) *Attorney, Agent, or Firm* — IP & T Group LLP

(57) ABSTRACT

A semiconductor device includes a control signal generator configured to generate a control signal that is enabled in a predetermined duration in response to an enabling of a chip selection signal, a clock controller configured to transfer a clock as a decoding clock in a duration for enabling of the control signal and disable the decoding clock in a duration for disabling of the control signal, and a command decoder configured to generate an internal command by decoding the chip selection signal and one or more command signals in synchronization with the decoding clock.

7 Claims, 4 Drawing Sheets

CONTROL SIGNAL GENERATOR FOR USE WITH A COMMAND DECODER

CROSS-REFERENCE TO RELATED APPLICATIONS

The present application claims priority of Korean Patent Application No. 10-2012-0030588, filed on Mar. 26, 2012, which is incorporated herein by reference in its entirety.

BACKGROUND

1. Field

Exemplary embodiments of the present invention relate to a semiconductor device, and more particularly, to a technology for controlling a command decoder that decodes a command inputted to a semiconductor device.

2. Description of the Related Art

A memory device performs diverse operations such as an active operation, a read operation, a write operation, a precharge operation, and a refresh operation in response to command signals received from an external memory controller. A circuit for decoding the command signals that are inputted from the source other than the memory device is referred to as a command decoder, which is described below.

FIG. 1 illustrates a structure related to a command decoder in a conventional memory device.

Referring to FIG. 1, the memory device includes pads 101 to 105, buffers 111 to 115, and a command decoder 120.

The pads 101 to 104 receive command signals RASB, CASB, WEB and CSB from the outside of the memory device, and the buffers 111 to 114 buffer the command signals RASB, CASB, WEB and CSB that are applied to the pads 101 to 104. The command signals include a row address strobe signal RASB, a column address strobe signal CASB, a write enable signal WEB, and a chip selection signal CSB. The symbol 'B' at the end of the command signals RASB, CASB, WEB and CSB represent that the signals are enabled to a logic low level.

The pad 105 receives an external clock CLK from the outside of the memory device, and the buffer 115 buffers the clock CLK, which is applied to the pad 115.

The command decoder 120 generates internal commands MRS, ACTIVE, WRITE, READ, REFRESH and PRECHARGE by decoding the command signals RASB, CASB, WEB and CSB in synchronization with the clock CLK. The internal commands include a mode register set command MRS, an active command ACTIVE, a write command WRITE, a read command READ, a refresh command REFRESH, and a precharge command PRECHARGE.

The command decoder 120 decodes the command signals RASB, CASB, WEB and CSB in synchronization with the clock CLK whenever the clock CLK toggles. In other words, there is a concern that the command decoder 120 continues to consume current whenever the clock CLK toggles. Therefore, there is a need to develop a technology that may reduce the amount of current consumed in the command decoder 120.

SUMMARY

Exemplary embodiments of the present invention are directed to a technology that may reduce the amount of current consumption in a command decoder.

In accordance with an embodiment of the present invention, a semiconductor device includes a control signal generator configured to generate a control signal that is enabled in a predetermined duration in response to an enabling of a chip selection signal, a clock controller configured to transfer a clock as a decoding clock in a duration for enabling of the control signal and disable the decoding clock in a duration for disabling of the control signal, and a command decoder configured to generate an internal command by decoding the chip selection signal and one or more command signals in synchronization with the decoding clock.

In accordance with another embodiment of the present invention, a semiconductor device includes one or more command buffers configured to receive one or more command signals, a chip selection signal buffer configured to receive a chip selection signal, a clock buffer configured to receive a clock, a clock path configured to transfer the clock that is inputted through the clock buffer, a replica path configured to have the same delay value as the clock path, and to transfer the command signals that are inputted through the command buffers and the chip selection signal that is inputted through the chip selection signal buffer, a latch configured to latch the command signals and the chip selection signal that are transferred through the replica path in synchronization with the clock that is transferred through the clock path, a control signal generator configured to generate a control signal that is enabled in a predetermined duration in response to an enabling of the chip selection signal that is transferred through the replica path, a clock controller configured to transfer the clock that is transferred through the clock path as a decoding clock in a duration for enabling of the control signal and disable the decoding clock in a duration for disabling of the control signal, and a command decoder configured to generate an internal command by decoding the chip selection signal and the command signals that are transferred through the replica path in synchronization with the decoding clock.

DETAILED DESCRIPTION

Figure 1:
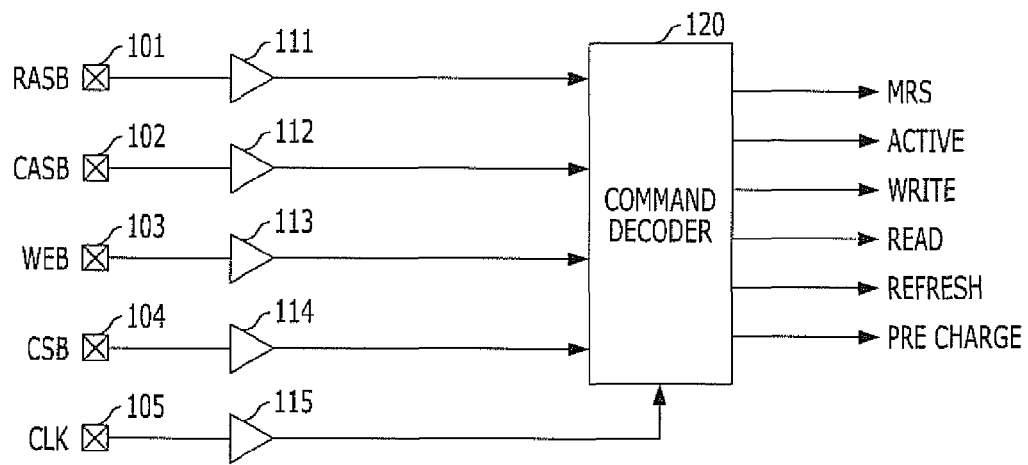
FIG. 1 illustrates a structure related to a command decoder in a conventional memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
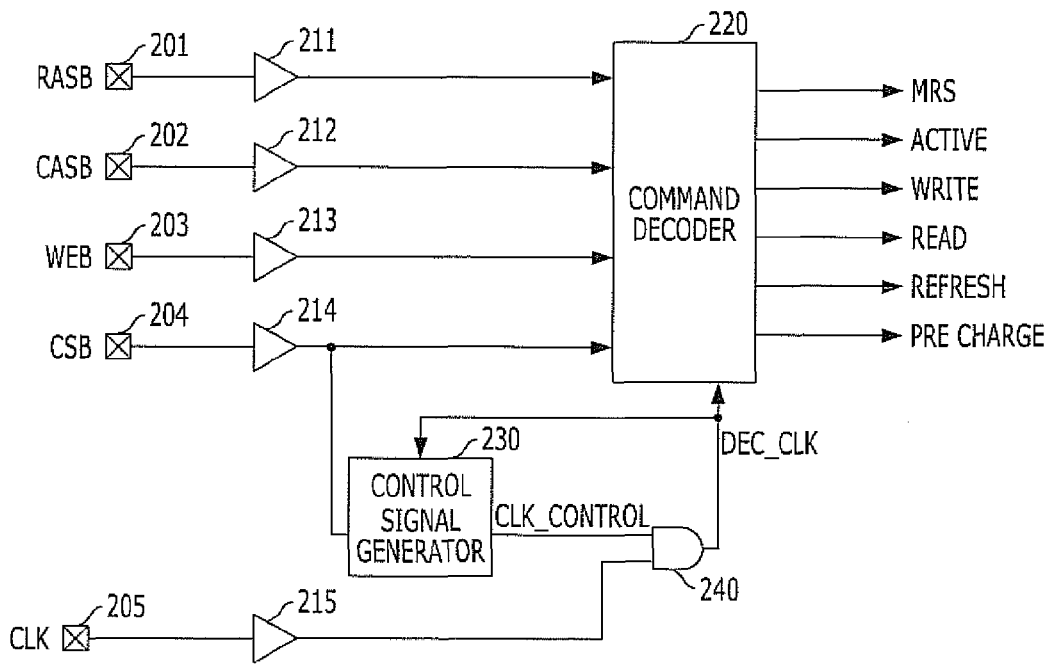
FIG. 2 illustrates a memory device in accordance with an embodiment of the present invention.

FIG. 2 illustrates a memory device in accordance with an exemplary embodiment of the present invention.

Referring to FIG. 2, the memory device includes pads 201 to 205, buffers 211 to 215, a control signal generator 230, a clock controller 240, and a command decoder 220.

The pads 201 to 204 receive command signals RASB, CASB, WEB and CSB from the source other than the memory device, and the buffers 211 to 214 buffer the command signals RASB, CASB, WEB and CSB that are applied to the pads 201 to 204. The command signals include a row address strobe signal RASB, a column address strobe signal CASB, a write enable signal WEB, and a chip selection signal CSB. The symbol 'B' at the end of the command signals RASB, CASB, WEB and CSB represent that the signals are enabled to a logic low level.

The pad 205 receives an external clock CLK from the source other than the memory device, and the buffer 215 buffers the clock CLK applied to the pad 115. Although this exemplary embodiment illustrates that the clock CLK is inputted from the source other than the memory device through the pad 205, the clock CLK may be inputted through two pads in a differential method.

The control signal generator 230 generates a control signal CLK_CONTROL that is enabled for a predetermined duration in response to the chip selection signal CSB, which is one among the command signals RASB, CASB, WEB and CSB. For example, the control signal generator 230 enables the control signal CLK_CONTROL in response to the enabling of the chip selection signal CSB, and when a fed-back decoding clock DEC_CLK is enabled as many times as a predetermined number, the control signal generator 230 disables the control signal CLK_CONTROL. The chip selection signal CSB is a signal informing that a corresponding chip, which is a memory device, is selected to operate. In other words, the memory device checks the logic levels of the other command signals RASB, CASB and WEB while the chip selection signal CSB is enabled and checks which command is applied to the memory device. Therefore, the duration for enabling of the control signal CLK_CONTROL represents a duration for performing a decoding operation by the command decoder 220.

The clock controller 240 transfers the clock CLK as the decoding clock DEC_CLK in a duration for enabling of the control signal CLK_CONTROL, and the clock controller 240 disables the decoding clock DEC_CLK in a duration for disabling of the control signal CLK_CONTROL. Herein, the decoding clock DEC_CLK is made not to toggle. The clock controller 240 may be designed as an AND gate that receives the control signal CLK_CONTROL and the clock CLK and outputs the decoding clock DEC_CLK.

The command decoder 220 generates internal commands MRS, ACTIVE, WRITE, READ, REFRESH and PRECHARGE by decoding the command signals RASB, CASB, WEB and CSB in synchronization with the decoding clock DEC_CLK. The command decoder 220 according to the embodiment of the present invention does not operate in synchronization with the clock CLK that toggles all the times as in the conventional technology, but operate in synchronization with the decoding clock DEC_CLK that toggles only in a duration for operation of the command decoder 220. Therefore, the command decoder 220 does not consume current unnecessarily.

Figure 3:
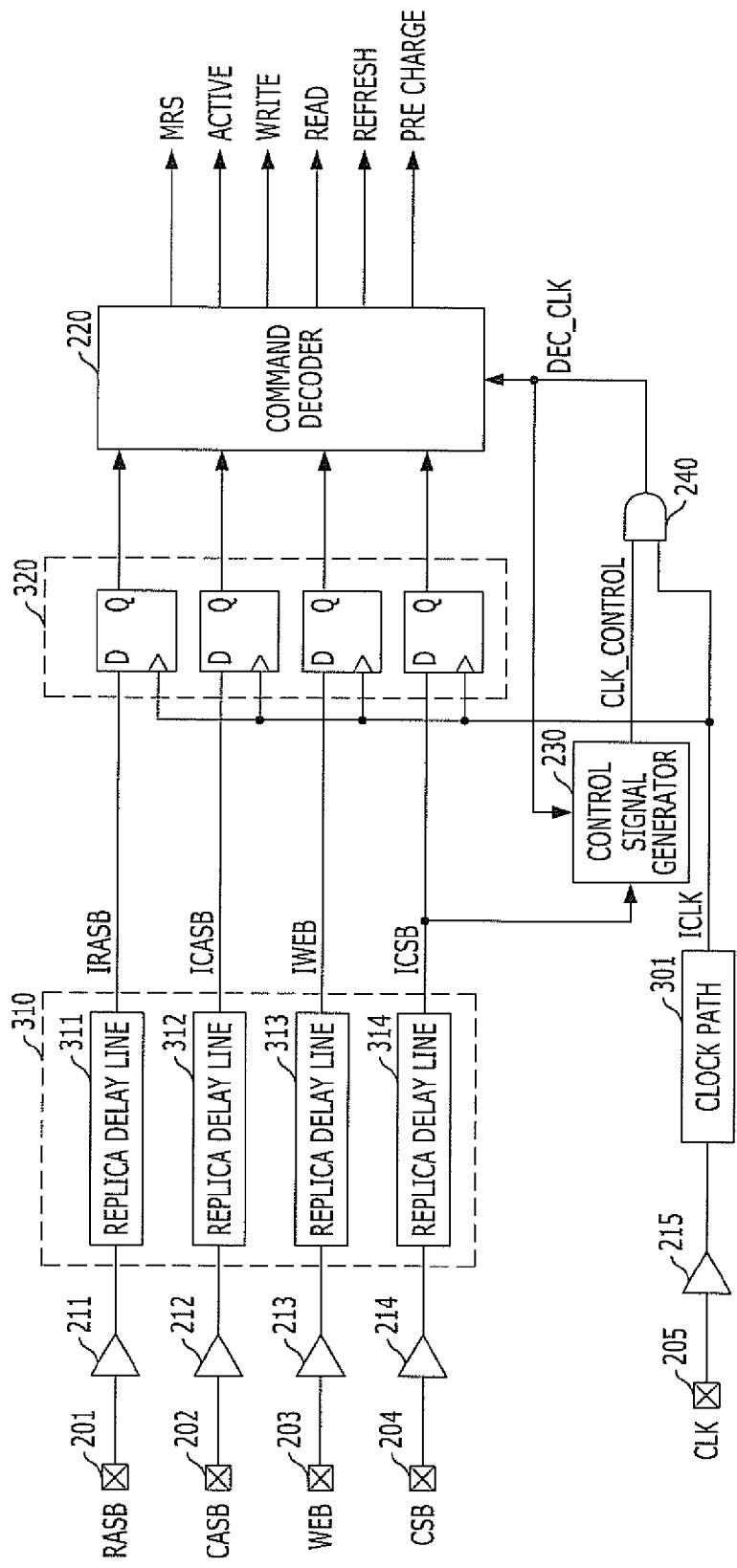
FIG. 3 illustrates a memory device in accordance with another embodiment of the present invention.

FIG. 3 illustrates a memory device in accordance with another embodiment of the present invention.

The embodiment of FIG. 3 provides a memory device that has the same structure and operation to the memory device of the exemplary embodiment of FIG. 2, except that the memory device of FIG. 3 further includes a structure 310 for timing tuning and a latch 320 for stable operation.

A clock path 301, or a clock tree, means a path that the clock CLK inputted to the buffer 215 is transferred to the command decoder 220. The clock CLK is delayed by a predetermined amount as the clock CLK passes through the clock path 301.

A replica path 310 includes a plurality of replica delay lines 311 to 314 that have the same delay value as the clock path 301. The replica delay lines 311 to 314 delay the command signals RASB, CASB, WEB and CSB, respectively, corresponding thereto. The replica path 310 compensates for the timing difference, which is a delay value, between the clock CLK and the command signals RASB, CASB, WEB and CSB in the memory device.

The latch 320 latches command signals IRASB, ICASB, IWEB and ICSB that are transferred through the replica path 310 in synchronization with a clock ICLK that is transferred through the dock path 301. The latch 320 is provided to stably transfer the command signals to the command decoder 220. The latch 320 may be formed to include flipflops as illustrated in the drawing.

Figure 4:
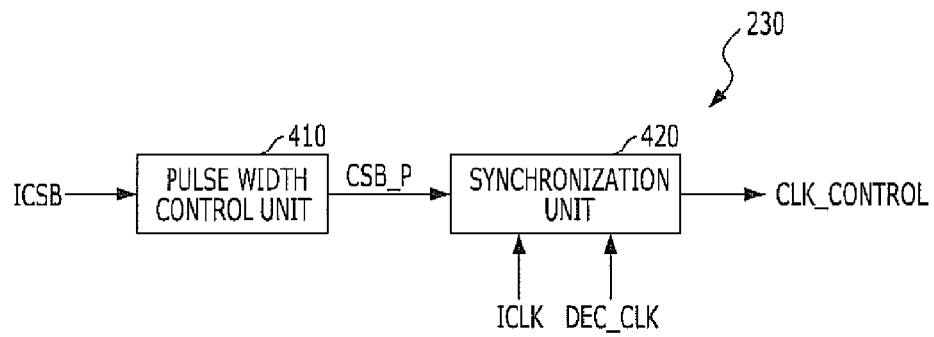
FIG. 4 is a block view illustrating a control signal generator 230 shown in FIG. 3.

FIG. 4 is a block view illustrating the control signal generator 230 shown in FIG. 3.

Referring to FIG. 4, the control signal generator 230 includes a pulse width control unit 410 and a synchronization unit 420.

The pulse width control unit 410 generates a pulse width-adjusted chip selection signal CSB_P by extending the pulse width of the chip selection signal ICSB that is transferred through the replica path 310. The pulse width of the chip selection signal ICSB is extended to secure stable operation of the synchronization unit 420, which is disposed behind the pulse width control unit 410.

The synchronization unit 420 enables a control signal CLK_CONTROL in response to an enabling of the pulse width-adjusted chip selection signal CSB_P, and when a decoding clock DEC_CLK that is fed back from the clock controller 240 is enabled as many times as a predetermined number, the synchronization unit 420 disables the control signal CLK_CONTROL.

Figure 5:
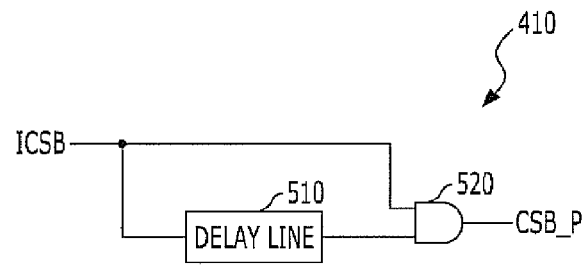
FIG. 5 is a block view illustrating a pulse width control unit 410 shown in FIG. 4.

FIG. 5 is a block view illustrating a pulse width control unit 410 shown in FIG. 4.

Referring to FIG. 5, the pulse width control unit 410 includes a delay line 510 and an AND gate 520. The delay line 510 delays the chip selection signal ICSB, and the AND gate 520 receives an output signal of the delay line 510 and the chip selection signal ICSB and outputs the pulse width-adjusted chip selection signal CSB_P.

The pulse width control unit 410 increases the pulse width of the chip selection signal ICSB by a delay value of the delay line 510. In other words, the pulse width of the pulse width-adjusted chip selection signal CSB_P is wider than the chip selection signal ICSB by the delay value of the delay line 510.

Figure 6:
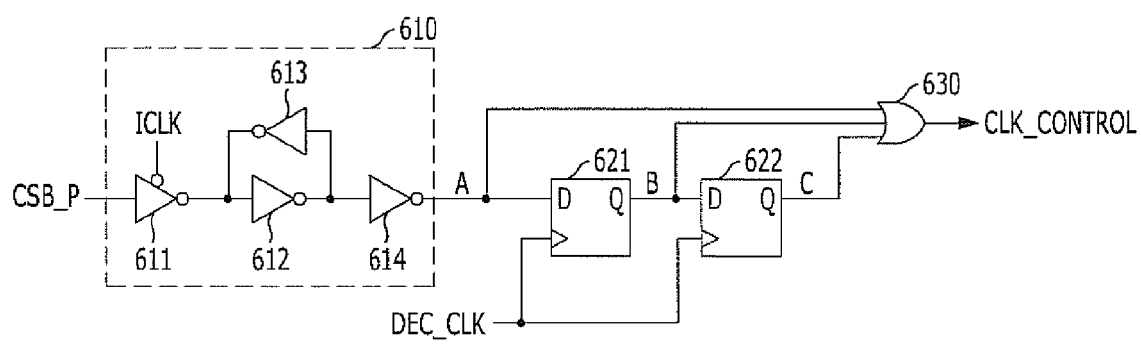
FIG. 6 is a block view illustrating a synchronization unit 420 shown in FIG. 4.

FIG. 6 is a block view illustrating a synchronization unit 420 shown in FIG. 4.

Referring to FIG. 6, the synchronization unit 420 includes a storage 610, one or more shifters 621 and 622, and an enabler 630.

The storage 610 receives and stores the pulse width-adjusted chip selection signal CSB_P in synchronization with the clock ICLK. The storage 610 may be formed to include a three-phase inverter 611 and inverters 612 to 614 as illustrated in the drawing.

The shifters 621 and 622 sequentially shift an output signal A of the storage 610 in synchronization with the decoding clock DEC_CLK. The duration for enabling of the decoding clock DEC_CLK is different based on the number of the shifters 621 and 622. For example, if there are two shifters, the decoding clock DEC_CLK is enabled three times after the chip selection signal ICSB is enabled. If there are three shifters, the decoding clock DEC_CLK is enabled four times after the chip selection signal ICSB is enabled. In other words, the decoding clock DEC_CLK is enabled 'the number of shifting+1' times after the chip selection signal ICSB is enabled.

The enabler 630 enables the control signal CLK_CONTROL when the output signal A of the storage 610 or at least one signal among the output signals B and C of the shifters 621 and 622 is enabled. When all of the signals A, B and C are disabled, the enabler 630 disables the control signal CLK_CONTROL.

Figure 7:
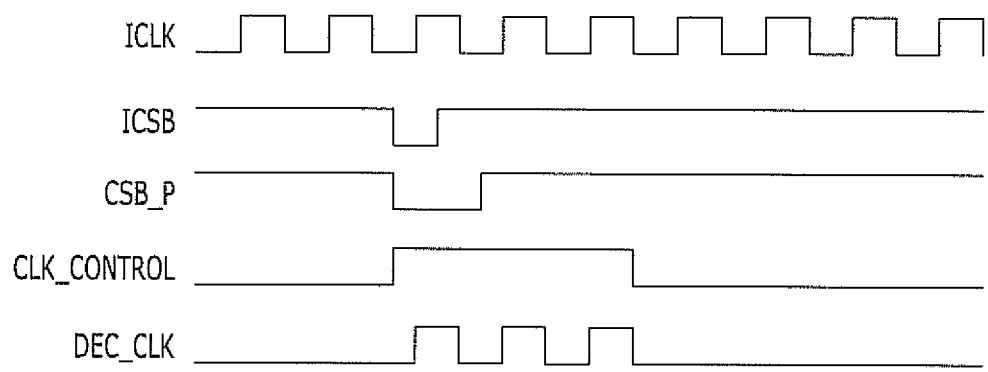
FIG. 7 illustrates the operations of the control signal generator 230 and a clock controller 240 shown in FIGS. 3 to 6.

FIG. 7 illustrates the operations of the control signal generator 230 and a clock controller 240 shown in FIGS. 3 to 6.

Referring to FIG. 7, the pulse width-adjusted chip selection signal CSB_P is generated as the pulse width control unit 410 increases the pulse width of the chip selection signal ICSB. When the pulse width-adjusted chip selection signal CSB_P is enabled to a logic low level, the control signal CLK_CONTROL is enabled to a logic high level in response to the enabling of the pulse width-adjusted chip selection signal CSB_P to the logic low level. While the control signal CLK_CONTROL is enabled, the clock ICLK is transferred as the decoding clock DEC_CLK. When the decoding clock DEC_CLK is enabled three times, the control signal CLK_CONTROL is disabled in response to the enabling of the decoding clock DEC_CLK three times. As a result, the decoding clock DEC_CLK is disabled as well, which means toggling stops.

In short, the decoding clock DEC_CLK is enabled three times from the moment when the chip selection signal ICSB is enabled, and the command decoder 220 operates in synchronization with the decoding clock DEC_CLK.

According to the exemplary embodiment of the present invention, the command decoder is controlled to operate at a moment when an internal command needs to be generated, and thus, the amount of current consumption may be reduced.

While the present invention has been described with respect to the specific embodiments, it will be apparent to those skilled in the art that various changes and modifications may be made without departing from the spirit and scope of the invention as defined in the following claims.

In particular, although the present invention is described by taking an example of a memory device, it is obvious to those skilled in the art that the technology of the present invention may be applied not only to the memory device but also to all kinds of semiconductor devices, or integrated circuit chips, that need to decode external command signals.

What is claimed is:

1. A semiconductor device, comprising:
a control signal generator configured to generate a control signal that is enabled in response to an enabling of a chip selection signal and disabled when a decoding clock is enabled as many times as a predetermined number;
a clock controller configured to transfer a clock as the decoding clock in a duration for enabling of the control signal and disable the decoding clock in a duration for disabling of the control signal; and
a command decoder configured to generate an internal command by decoding the chip selection signal and one or more command signals in synchronization with the decoding clock.

2. The semiconductor device of claim 1, further comprising:
A plurality of buffers configured to receive the chip selection signal, the command signals, and the clock from outside of the semiconductor device.

3. The semiconductor device of claim 1, wherein the control signal generator includes:
a pulse width control unit for generating a pulse width-adjusted chip selection signal by extending a pulse width of the chip selection signal; and
a synchronization unit for enabling the control signal in response to an enabling of the pulse width-adjusted chip selection signal and for disabling the control signal if the decoding clock is enabled as many times as a predetermined number.

4. The semiconductor device of claim 3, wherein the synchronization unit includes:
a storage for receiving and storing the pulse width-adjusted chip selection signal in synchronization with the clock;
one or more shifters for sequentially shifting an output signal of the storage in synchronization with the decoding clock; and
an enabler for enabling the control signal if the output signal of the storage and at least one signal among output signals of the shifters are enabled.

5. A semiconductor device, comprising:
one or more command buffers configured to receive one or more command signals;
a chip selection signal buffer configured to receive a chip selection signal;
a clock buffer configured to receive a clock;
a clock path configured to transfer the clock that is inputted through the clock buffer;
a replica path configured to have the same delay value as the clock path, and to transfer the command signals that are inputted through the command buffers and the chip selection signal that is inputted through the chip selection signal buffer;
a latch configured to latch the command signals and the chip selection signal that are transferred through the replica path in synchronization with the clock that is transferred through the clock path;
a control signal generator configured to generate a control signal that is enabled in response to an enabling of the chip selection signal that is transferred through the replica path and disabled when a decoding clock is enabled as many times as a predetermined number;
a clock controller configured to transfer the clock that is transferred through the clock path as the decoding clock in a duration for enabling of the control signal and disable the decoding clock in a duration for disabling of the control signal; and
a command decoder configured to generate an internal command by decoding the chip selection signal and the command signals that are transferred through the replica path in synchronization with the decoding clock.

6. The semiconductor device of claim 5, wherein the control signal generator includes:
a pulse width control unit for generating a pulse width-adjusted chip selection signal by extending a pulse width of the chip selection signal that is transferred through the replica path; and
a synchronization unit for enabling the control signal in response to an enabling of the pulse width-adjusted chip selection signal and for disabling the control signal if the decoding clock is enabled as many times as a predetermined number.

7. The semiconductor device of claim 6, wherein the synchronization unit includes:
a storage for receiving and storing the pulse width-adjusted chip selection signal in synchronization with the clock that is transferred through the clock path;

one or more shifters for sequentially shifting an output signal of the storage in synchronization with the decoding clock; and an enabler for enabling the control signal if the output signal of the storage or at least one signal among output signals of the shifters is enabled.

* * * * *